US 6,707,354 B2

United States Patent
Pollet et al.

(10) Patent No.: US 6,707,354 B2
(45) Date of Patent: Mar. 16, 2004

(54) ACTIVE CIRCUIT FOR SYNTHESIZING AN INDUCTOR

(75) Inventors: Thierry Pollet, Mechelen (BE); Stéphane Bloch, Rhode Saint Genese (BE)

(73) Assignee: Alcatel, Paris (FR)

(*) Notice: Subject to any disclaimer, the term of this patent is extended or adjusted under 35 U.S.C. 154(b) by 0 days.

(21) Appl. No.: 10/113,598

(22) Filed: Apr. 2, 2002

(65) Prior Publication Data

US 2002/0180509 A1 Dec. 5, 2002

(30) Foreign Application Priority Data

Apr. 3, 2001 (EP) .............................. 01400841

(51) Int. Cl.$^7$ .............................................. H03H 11/48
(52) U.S. Cl. ...................................... 333/214; 333/216
(58) Field of Search ................................ 333/213, 214, 333/215, 216, 217

(56) References Cited

U.S. PATENT DOCUMENTS 3,993,968 A * 11/1976 Lee ............................ 333/214

4,513,265 A * 4/1985 Sokoloff ..................... 333/214
6,028,496 A   2/2000 Ko et al.

FOREIGN PATENT DOCUMENTS

| DE | 3009118 | * | 9/1981 | .................. 333/213 |
| JP | 53065041 |   | 6/1978 |                            |
| JP | 101111  | * | 5/1987 | .................. 333/214 |
| RU | 1073885 | * | 2/1984 | .................. 333/213 |

OTHER PUBLICATIONS

A. W. Keen et al, "Inductance simulation with a Single Differential–Input Operational Amplifier", Electronics Letters, vol. 3, No. 4, Apr. 1, 1967, pp. 136–137 XP002175043.

* cited by examiner

Primary Examiner—Benny Lee
(74) Attorney, Agent, or Firm—Sughrue Mion, PLLC

(57) ABSTRACT

A circuit for an apparatus is an active circuit that synthesizes self-induction. The active circuit comprises only one operational amplifier. With the use of tunable capacitors, the inductor synthesized by the active circuit becomes a tunable inductor.

6 Claims, 1 Drawing Sheet

ACTIVE CIRCUIT FOR SYNTHESIZING AN INDUCTOR

FIELD OF THE INVENTION

The present invention is related to active circuits, in particular active inductors, which are incorporated in integrated circuits.

STATE OF THE ART

Active inductors have been described, for example in document U.S. Pat. No. 6,028,496, which is related to a device comprising two Operational Amplifiers (OPAMPS). The active inductor of this document includes an inverting amplifier of a common source (common emitter) type, which inversely amplifies an input signal and outputs the amplified signal as an output signal, a non-inverting amplifier of a common gate (common base) type, which non-inversely amplifies the output signal and the amplified signal as the input signal, a capacitor connected between the input signal and a reference signal, and a biasing portion for biasing the inverting amplifier and the non-inverting amplifier.

A general drawback of these existing active inductors is the fact that they all comprise at least two Operational Amplifiers, leading to a relatively high power consumption.

AIMS OF THE INVENTION

The present invention aims to provide an active inductor which consumes less power compared to the active inductors belonging to the current state of the art.

SUMMARY OF THE INVENTION

The present invention is related to an apparatus comprising an active circuit, the circuit synthesising an inductor, characterised in that the circuit comprises one Operational Amplifier.

According to a preferred embodiment, the invention is related to an apparatus comprising an active circuit, wherein the circuit comprises:

- an Operational Amplifier with a non-inverting input terminal, an inverting input terminal, a non-inverting output terminal and an inverting output terminal,
- a first resistor R1 and a first capacitance C1, connected in cascade between the inverting input terminal and a first output terminal of the active circuit,
- a second resistor R1', having the same resistance as R1, and a second capacitance C1', having the same capacitance value as C1, connected in cascade between the non-inverting input terminal and a second output terminal of said the active circuit,
- a third resistor R2 and a fourth resistor R3, connected in cascade between the non-inverting input terminal and the first output terminal of the circuit,
- a fifth resistor R2', having the same resistance as R2, and a sixth resistor R3', having the same resistance as R3, the resistors R2' and R3' being connected in cascade between the inverting input terminal and the second output terminal of the circuit,
- a seventh resistor Rx and a third capacitance Cx, connected in parallel, and coupled between the inverting output terminal and a common node of the third resistor R2 and the fourth resistor R3,
- an eighth resistor Rx', having the same resistance as Rx, and a fourth capacitance Cx', having the same capacitance value as Cx, the resistor Rx' and the capacitance Cx' being connected in parallel, and coupled between the non-inverting output terminal and a common node of the fifth resistor R2' and the sixth resistor R3 ',
- a ninth resistor R4 connected between the inverting output terminal and the first output terminal of the circuit, and an tenth resistor R4', connected between the non-inverting output terminal and the second output terminal of said circuit.

According to the preferred embodiment of the present invention, the resistance values of R4 and R4' obey the following formula:

$$R4 = R4' = \frac{(C1 \cdot R1 + (2C1 - Cx) \cdot Rx) \cdot R3 + C1 \cdot R1 \cdot Rx}{Cx \cdot Rx - C1 \cdot R1}$$

According to a further embodiment, the invention is related to an apparatus wherein the inductor synthesised by said active circuit is tuneable. This may be realised by making the capacitors C1, C1', Cx and Cx' tuneable.

According to another embodiment, the ratio between C1 and Cx is constant.

According to another embodiment, the value Rx.Cx is greater than R1.C1.

DETAILED DESCRIPTION OF THE INVENTION

Figure 1:
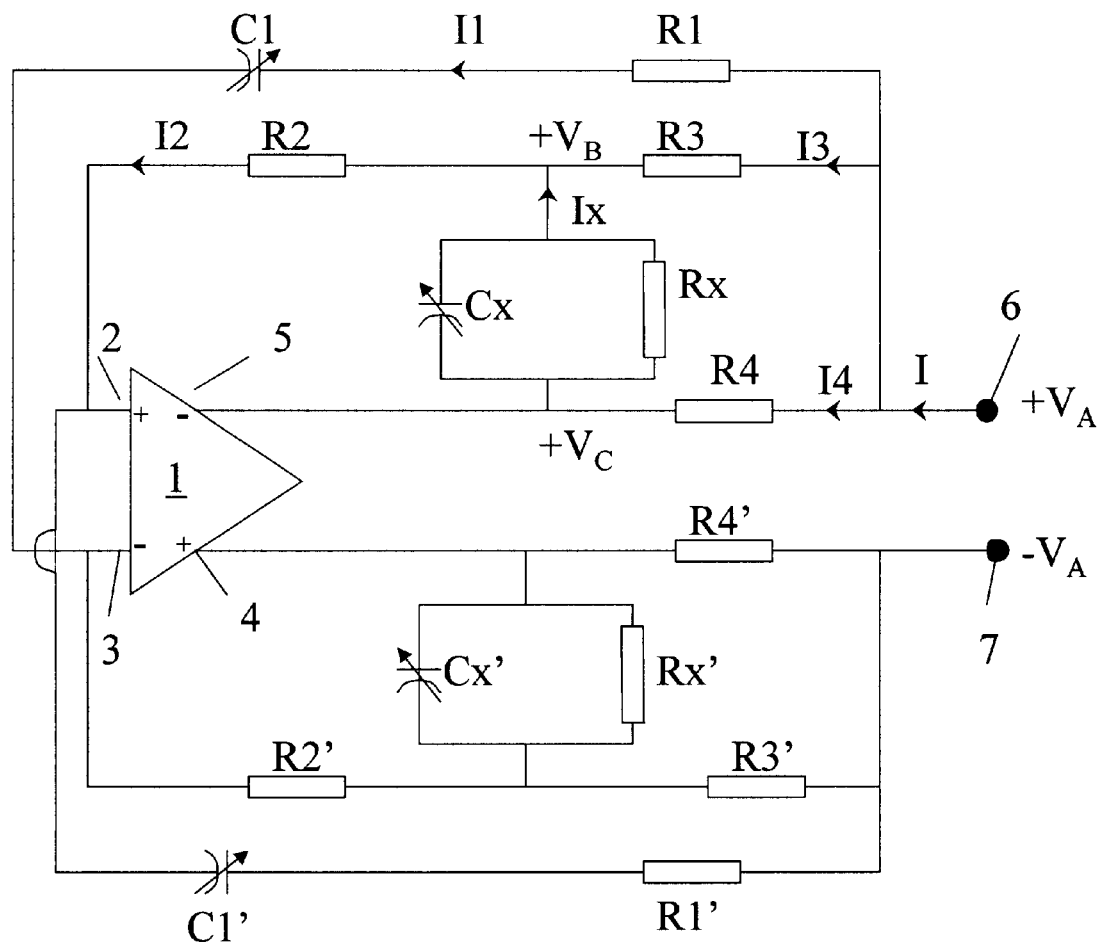
FIG. 1 represents the circuit of an active inductor according to the present invention.

Referring to FIG. 1, the device according to a preferred embodiment of the invention is hereafter disclosed. The main characteristic of the invention is the fact that an active circuit is proposed, for synthesising an inductor, comprising only one Operational Amplifier.

The circuit can be made tuneable in order to select the self-inductance value. FIG. 1 shows the embodiment wherein the circuit is tuneable, due to the presence of tuneable capacitors. An alternative would be the use of tuneable resistors or a combination of tuneable resistors and capacitors.

The operational amplifier 1 has non-inverting and inverting input terminals 2 and 3, and non-inverting and inverting output terminals 4 and 5.

The inverting input terminal 3 of the operational amplifier 1 is coupled via the cascade connection of a resistor R1 and a tuneable capacitance C1 to a first output terminal 6 of the circuit, and is coupled via the cascade connection of two resistors R2' and R3' to a second output terminal 7 of the circuit.

The non-inverting input terminal 2 of the operational amplifier 1 is coupled via the cascade connection of a resistor R1' and a tuneable capacitance C1' to the second output terminal 7 of the circuit, and is coupled via the cascade connection of two resistors R2 and R3 to the first output terminal 6 of the circuit.

The inverting output terminal 5 of the operational amplifier 1 is coupled via a resistor R4 to the first output terminal 6 of the circuit, and via the parallel connection of an tuneable capacitance Cx and a resistor Rx to the common node of the resistors R2 and R3.

The non-inverting output terminal 4 of the operational amplifier 1 is coupled via a resistor R4' to the second output terminal 7 of the circuit, and via the parallel connection of a tuneable capacitance Cx' and a resistor Rx' to the common node of the resistors R2' and R3'.

In the following discussion, taken with reference to the drawing FIGURE, it will be appreciated that $+V_A$ and $-V_A$ in the FIGURE represent the voltage at terminals 6 and 7, respectively, that $+V_B$ is the voltage at the otherwise unlabeled node by which the symbol $+V_B$ appears (this voltage may also be referred to simply as $V_B$), and that $+V_C$ is the voltage at the otherwise unlabeled node by which the symbol $+V_C$ appears (this voltage may also be referred to simply as $V_C$).

The following is true for the values of the above described resistors and capacitances:

R1=R1'; R2=R2'; R3=R3'; R4=R4'; Rx=Rx'; C1=C1'; Cx=Cx'

According to the invention, the resistor $R_4$ (and R4') is chosen such that:

$$R_4 = R_4' = \frac{(C_1 \cdot R_1 + (2C_1 - C_X) \cdot R_X) \cdot R_3 + C_1 \cdot R_1 \cdot R_X}{C_X \cdot R_X - C_1 \cdot R_1}$$

As a result, the synthesised impedance behaves like the serial connection of a resistor and an inductor:

$$Z_{SYNTH} = R_{SYNTH} + j\omega L_{SYNTH}.$$

Herein:

$$R_{SYNTH} = \frac{2 \cdot R_3 \cdot R_4}{R_3 + R_4 + R_X} \text{ and}$$

$$L_{SYNTH} = \frac{2 \cdot R_3 \cdot R_4 \cdot R_X \cdot C_X}{R_3 + R_4 + R_X} = R_{SYNTH} \cdot R_X \cdot C_X.$$

This is proven by the following mathematical derivation. The synthesized impedance is given by:

$$Z_{SYNTH} = \frac{V_A - (-V_A)}{I} = \frac{2V_A}{I} \quad (1)$$

with $V_A$ being the supply voltage.

The current 1 shown in FIG. 1, can be written as a function of currents $I_1$, $I_3$, and $I_4$:

$$I = I_1 + I_3 + I_4 \quad (2)$$

$I_1$, $I_3$, and $I_4$ are determined below.
$I_1$ can be determined by expressing that the operational amplifier 1 is virtually grounded:

$$I_1 = \frac{V_A - 0}{Z_1} = \frac{V_A}{Z_1} \quad (3)$$

Herein, $Z_1 = R_1 + \frac{1}{j\omega C_1} \quad (4)$

Furthermore, $I_3 = \frac{V_A - V_B}{R_3}$ with $\quad (5)$ $V_B = R_2 \cdot I_2 \quad (6)$ Kirchoff's law applied at the non-inverting input 2 results in:

$$-I_1 + I_2 = 0 \Rightarrow I_2 = I_1 = \frac{V_A}{Z_1} \quad (7)$$

Substituting (7) in (6) results in:

$$V_B = V_A \cdot \frac{R_2}{Z_1} \quad (8)$$

so that (5) turns into:

$$I_3 = V_A \cdot \frac{1 - \frac{R_2}{Z_1}}{R_3} = V_A \cdot \frac{Z_1 - R_2}{R_3 \cdot Z_1} \quad (9)$$

From FIG. 1, one derives that:

$$I_4 = \frac{V_A - V_C}{R_4} \text{ with} \quad (10)$$

$$V_C = V_B + I_X \cdot Z_X \quad (11)$$

Herein, $Z_X = R_X // C_X = \dfrac{1}{\dfrac{1}{R_X} + j\omega C_X} = \dfrac{R_X}{1 + j\omega R_X \cdot C_X} \quad (12)$ Kirchoff's law applied in the VB node, results in:

$$I_3 + I_X - I_2 = 0 \rightarrow I_X = I_2 - I_3 \quad (13)$$

After substitution of (7) and (9) in (13), one obtains:

$$I_X = \frac{V_A}{Z_1} - V_A \cdot \frac{Z_1 - R_2}{R_3 \cdot Z_1} = V_A \cdot \frac{R_2 + R_3 - Z_1}{R_3 \cdot Z_1} \quad (14)$$

From equation (11), $V_C$ can now be derived:

$$V_C = V_A \cdot \frac{R_2}{Z_1} + V_A \cdot \frac{Z_X \cdot (R_2 + R_3 - Z_1)}{R_3 \cdot Z_1}$$
$$= V_A \cdot \frac{R_3 \cdot R_2 + Z_X \cdot (R_2 + R_3 - Z_1)}{R_3 \cdot R_4 \cdot Z_1} \quad (15)$$

(15) can be substituted in equation (10), resulting in:

$$I_4 = V_A \cdot \frac{R_3 \cdot Z_1 - R_3 \cdot R_2 + Z_X \cdot (Z_1 - R_2 - R_3)}{R_3 \cdot R_4 \cdot Z_1} \quad (16)$$

The expressions found in (3), (9) and (16) are to be substituted in (2) to find the current I:

$$I = I_1 + I_3 + I_4 \quad (17)$$

$$= V_A \cdot \frac{R_3 \cdot R_4 - R_2 \cdot R_4 + Z_1 \cdot R_4 + R_3 \cdot Z_1 - R_3 \cdot R_2 + Z_X \cdot (Z_1 - R_2 - R_3)}{R_3 \cdot R_4 \cdot Z_1}$$

$$= V_A \cdot \frac{(R_3 + R_4) \cdot (Z_1 - R_2) + \frac{R_3 \cdot R_4}{R_3 + R_4} \cdot (R_3 + R_4) + Z_X \cdot (Z_1 - R_2 - R_3)}{R_3 \cdot R_4 \cdot Z_1}$$

Herein, $\dfrac{R_3 \cdot R_4}{R_3 + R_4} = R_3 // R_4 \quad (18)$ and consequently:

$$I = V_A \cdot \frac{(R_3 + R_4) \cdot (Z_1 - R_2 + R_3 // R_4) + Z_X \cdot (Z_1 - R_2 - R_3)}{R_3 \cdot R_4 \cdot Z_1} \quad (19)$$

$R_2$ is chosen as specified by (20)

$$R_2 = R_1 + R_3 // R_4 \approx R_1 + R_3 \quad (20)$$

In order to fulfill the approximate equality, $R_3$ should preferably not be higher than 20% of $R_4$.
and by substituting (4) and (12) in (19), the expression for I becomes:

$$I = \frac{(R_3 + R_4 + R_X) \cdot \left(1 + j\omega \frac{C_X \cdot R_X \cdot (R_3 + R_4) - 2 \cdot C_1 \cdot R_3 \cdot R_X}{R_3 + R_4 + R_X}\right)}{R_3 \cdot R_4 \cdot (1 + j\omega C_1 \cdot R_1) 1 (1 + j\omega R_X \cdot C_X)} \cdot V_A \quad (21)$$

If $R_4$ is now chosen such that:

$$R_4 = \frac{(C_1 \cdot R_1 + (2C_1 - C_X) \cdot R_X) \cdot R_3 + C_1 \cdot R_1 \cdot R_X}{C_X \cdot R_X - C_1 \cdot R_1} \quad (22)$$

and (21) is substituted into (1), then the synthesized impedance behaves like the serial connection of a resistor and an inductor:

$$Z_{SYNTH} = R_{SYNTH} + j\omega L_{SYNTH} \quad (23)$$

with $$R_{SYNTH} = \frac{2 \cdot R_3 \cdot R_4}{R_3 + R_4 + R_X} \text{ and} \quad (24)$$

$$L_{SYNTH} = \frac{2 \cdot R_3 \cdot R_4 \cdot R_X \cdot C_X}{R_3 + R_4 + R_X} = R_{SYNTH} \cdot R_X \cdot C_X \quad (25)$$

The resistor $R_{SYNTH}$ can be made smaller than 1 Ω by choosing a high Rx, while the inductor can be a few $\mu$H. In order to keep R4 constant with C1 and Cx variable, a constant ratio should be chosen between C1 and Cx. Typically, Rx.Cx must be greater than R1.C1 in order to have a significantly high inductance with a small resistor value.

For example:
R1=R1'=500 ω
R3=R3'=10 ω
R2=R2'32 510 ω
Rx=Rx'=1500 ω
R4=R4'=82 ω
RSYNTH=1.1 ω
Cx/C1=6
For LSYNTH=2 $\mu$H, we find Cx=1.21 nF

What is claimed is:

1. A circuit for synthesizing an inductor, comprising:

an operational amplifier with a non-inverting input terminal, an inverting input terminal, a non-inverting output terminal and an inverting output terminal;

a first resistor R1 and a first capacitance C1, connected in cascade between said inverting input terminal and a first output terminal of said active circuit;

a second resistor R1', having the same resistance as R1, and a second capacitance C1', having the same capacitance value as C1, connected in cascade between said non-inverting input terminal and a second output terminal of said active circuit;

a third resistor R2 and a fourth resistor R3, connected in cascade between said non-inverting input terminal and said first output terminal of said circuit;

a fifth resistor R2', having the same resistance as R2, and a sixth resistor R3', having the same resistance as R3, said resistors R2' and R3' being connected in cascade between said inverting input terminal and said second output terminal of said circuit;

a seventh resistor Rx and a third capacitance Cx, connected in parallel, and coupled between said inverting output terminal and a common node of said third resistor R2 and said fourth resistor R3;

an eighth resistor Rx', having the same resistance as Rx, and a fourth capacitance Cx', having the same capacitance value as Cx, said resistor Rx' and said capacitance Cx' being connected in parallel, and coupled between said non-inverting output terminal and a common node of said fifth resistor R2' and said sixth resistor R3'; and a ninth resistor R4 connected between said inverting output terminal and said first output terminal of said circuit, and an tenth resistor R4', connected between said non-inverting output terminal and said second output terminal of said circuit.

2. The circuit according to claim 1, wherein the value Rx.Cx is greater than R1.C1.

3. The circuit according to claim 1, wherein $$R4 = R4' = \frac{(C1 \cdot R1 + (2C1 - Cx) \cdot Rx) \cdot R3 + C1 \cdot R1 \cdot Rx}{Cx \cdot Rx - C1 \cdot R1}.$$

4. The circuit according to claim 1, wherein the inductor synthesised by said active circuit is tunable.

5. The circuit according to claim 4, wherein said capacitors C1, C1', Cx and Cx' are tunable.

6. The circuit according to claim 1 wherein the ratio between C1 and Cx is constant.

* * * * *